United States Patent [19]

Inoue et al.

[11] Patent Number: 5,741,725
[45] Date of Patent: Apr. 21, 1998

[54] FABRICATION PROCESS FOR SEMICONDUCTOR DEVICE HAVING MOS TYPE FIELD EFFECT TRANSISTOR

[75] Inventors: Ken Inoue; Kunihiro Fujii, both of Tokyo, Japan

[73] Assignee: NEC Corporation, Japan

[21] Appl. No.: 607,301

[22] Filed: Feb. 26, 1996

[30] Foreign Application Priority Data

Feb. 27, 1995 [JP] Japan ............... 7-038397

[51] Int. Cl.$^6$ ............................. H01L 21/44
[52] U.S. Cl. ............... 437/200; 437/192; 437/193; 437/239
[58] Field of Search ............... 437/193, 200, 437/192, 239

[56] References Cited

U.S. PATENT DOCUMENTS

| | | | |
|---|---|---|---|
| 4,533,935 | 8/1985 | Mochizuki | 257/538 |
| 4,545,116 | 10/1985 | Lau | 437/200 |
| 4,636,833 | 1/1987 | Nishioka et al. | 257/476 |
| 4,665,608 | 5/1987 | Okamoto et al. | 437/15 |
| 5,043,300 | 8/1991 | Nulman | 437/200 |
| 5,187,122 | 2/1993 | Bonis | 437/200 |
| 5,227,320 | 7/1993 | Johnson et al. | 437/200 |
| 5,340,761 | 8/1994 | Loh et al. | 437/200 |
| 5,405,789 | 4/1995 | Dekker et al. | 437/192 |
| 5,429,979 | 7/1995 | Lee et al. | 437/919 |
| 5,444,006 | 8/1995 | Han et al. | 437/238 |

OTHER PUBLICATIONS

Climent et al., "Oxide growth on silicides in oxygen plasma", Applied Surface Science, vol. 36, nos. 1–4, pp. 185–195, Jan. 1, 1989.

C.K. Lau, et al., "Titanium Disilicide Self–Aligned Source/Drain + Gate Technology", IEDM, 1982, pp. 714–717.

Primary Examiner—John Niebling
Assistant Examiner—Kevin Turner

[57] ABSTRACT

A titanium layer is formed by depositing titanium over entire surface of a gate electrode, a P-type silicon substrate, an insulation layer, an oxide layer and so forth. By effecting first RTA (Rapid Thermal Annealing) under nitrogen atmosphere, titanium silicide layer of C49 type structure is formed. At this time, the regions of the titanium layer which are on the oxide layer and the insulation layer and upper part of the region of the titanium layer which is formed on the silicon substrate are reacted with $N_2$ gas to produce titanium nitride layer. In conjunction therewith, titanium layer on the surface of the insulation layer and the oxide layer is slightly reacted to form titanium silicide thin film. Subsequently, only titanium nitride is selectively removed. Thereafter, under oxygen atmosphere, second RTA is performed at 850° C. for 10 sec. to oxidize the titanium silicide thin film to make it insulative. At the same time, the titanium silicide layer of C49 type structure is caused phase transition into titanium silicide layer of C54 type structure with lowering of electric resistivity.

11 Claims, 8 Drawing Sheets

FABRICATION PROCESS FOR SEMICONDUCTOR DEVICE HAVING MOS TYPE FIELD EFFECT TRANSISTOR

BACKGROUND OF THE INVENTION

1. Field of the Invention

The present invention relates generally to a fabrication process for a semiconductor device. More specifically, the invention relates to a fabrication process for a semiconductor device having a MOS type field effect transistor, which can lower resistance by forming silicide in a gate electrode and source and drain regions in self-align manner.

2. Description of the Related Art

As one of fabrication process for a semiconductor device, salicide process has been known. The salicide process employing titanium as a material for formation of silicide has been disclosed in "Titanium Disilicide Self-Aligned Source/Drain and Gate Technology," the International Electron Devices Meeting ("IEDM") of the Institute of Electrical and Electronic Engineers, pp 714 to 717, 1982. The reason of employment of titanium as a material for formation of silicide is that titanium silicide has the lowest resistivity among refractory metal silicides.

FIGS. 1A to 1E are cross-sectional views showing a conventional salicide process in order of process steps.

Figure 1A:
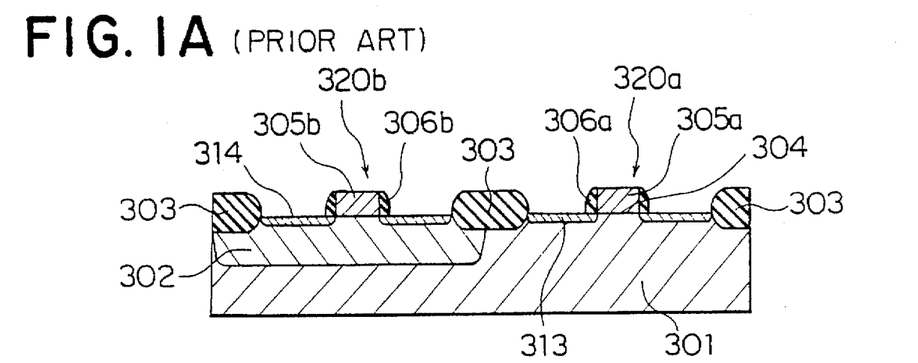
FIGS. 1A to 1E are sectional views showing the conventional salicide process in the order of process steps.

As shown in FIG. 1A, after selectively forming N-well region 302 on P-type silicon substrate 301, a field oxide layer 303 of silicon oxide is formed by selective oxidation surrounding a region 320a reversed for forming N-MOS field effect transistor (NMOSFET) which region will be hereinafter referred to as NMOSFET reserved region, on the P-type silicon substrate 301 and a region 320b reserved for forming P-MOS field effect transistor (PMOSFET) which region will be hereinafter referred to as PMOSFET reserved region, on N-well region 302.

Then, after forming gate oxide layers 304 of silicon oxide over the NMOSFET and PMOSFET reserved regions 320a and 320b, a polycrystalline silicon layer (not shown) is grown on the gate oxide layers 304. Thereafter, by doping the polycrystalline silicon layer with phosphorus, electrical resistance of the polycrystalline silicon is lowered. Then, by way of photolithography and dry etching, the polycrystalline silicon layer is patterned to form the gate electrodes 305a and 305b in the NMOSFET and PMOSFET reserved regions 320a and 320b.

Subsequently, by way of photolithography and ion implantation, N⁻ type impurity diffusion layer 313 is selectively formed in the NMOSFET reserved regions 320a on the P-type silicon substrate 301. And P⁻ type impurity diffusion layer 314 is selectively formed on the N-well region 302 of the PMOSFET reserved region 320b. Subsequently, by way of CVD and anisotropic dry etching, side wall insulation layers (silicon oxide layers or silicon nitride layers) 306a and 306b are formed on the side surfaces of the gate electrodes 305a and 305b.

Figure 1B:
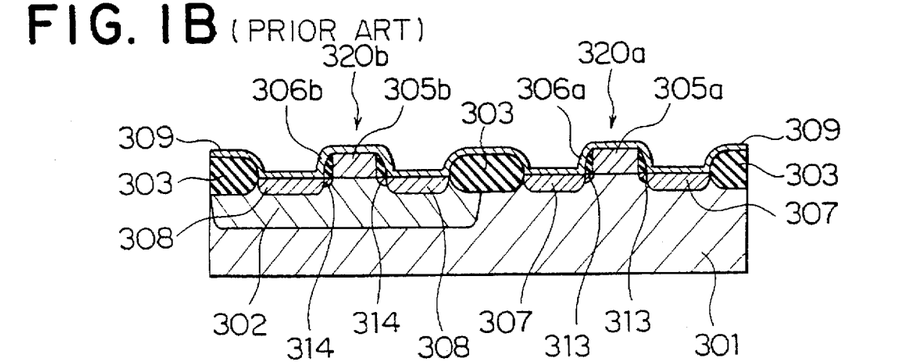

Thereafter, as shown in FIG. 1B, ions are implanted in the N⁺ type impurity diffusion layer 313 and the P⁺ type impurity diffusion layer 314 by photolithographic method to form N type-impurity diffusion layer 307 and P-type impurity diffusion layer 308. Thus, as LLD (Lightly Doped Drain) structure, N-type source and drain regions (N-type impurity diffusion layer 307) is formed in the NMOSFET reserved region 320a, and P-type source and drain region (P-type impurity diffusion layer 308) are formed in the PMOSFET reserved region 320b. Then, after removing oxide layer (not shown) naturally formed on the gate electrodes 305a and 305b, and the P-type silicon substrate 301 exposed to the surface, a titanium layer 309 is formed by depositing titanium by sputtering on the P-type silicon substrate 301 and the field oxide layer 303.

Figure 1C:
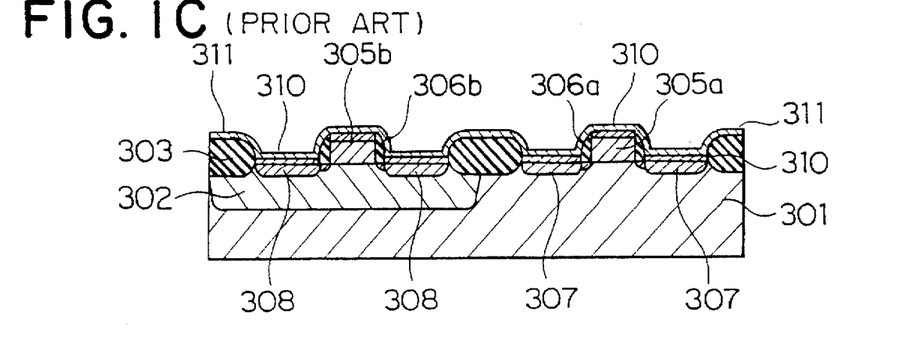

Subsequently, as shown in FIG. 1C, first RTA (Rapid Thermal Annealing) is performed at a temperature lower than or equal to 700° C. in a nitrogen atmosphere to cause reaction (formation of silicide) in only regions of the titanium layer 309 which directly contact with the silicon (the gate electrodes 305a and 305b and the impurity diffusion layers 307 and 308) to form titanium silicide layers 310 of C49 type structure. At this time, a region of the titanium layer 309 which contacts with the oxide (the field oxide layer 303 and the side wall insulation layer 306a and 306b) reacts with N₂ gas to produce a titanium nitride layer 311. Also, upper parts of the regions of the titanium layer 309 which are on the P-type silicon substrate 301 and the gate electrodes 305a, 305b react with N₂ gas to produce titanium nitride layers 311, because the upper parts of them do not suffer reaction to form silicide.

Figure 1D:
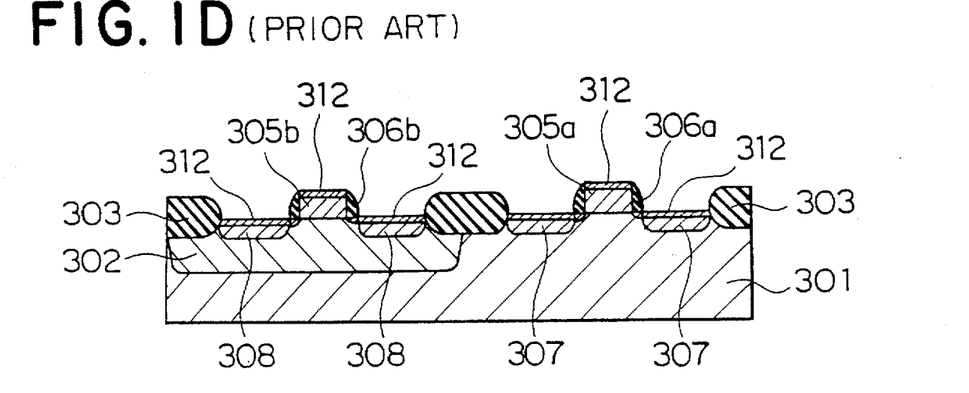

Subsequently, as shown in FIG. 1D, with a mixer of ammonia solution and hydrogen peroxide solution, wet etching is performed to selectively remove only titanium nitride layer 311. Thereafter, under nitrogen atmosphere, second RTA is performed at a temperature higher than or equal to 800° C. to convert the titanium silicide layer 310 of C49 type structure into titanium silicide layer 312 of C54 type structure having lower electrical resistivity.

Figure 1E:
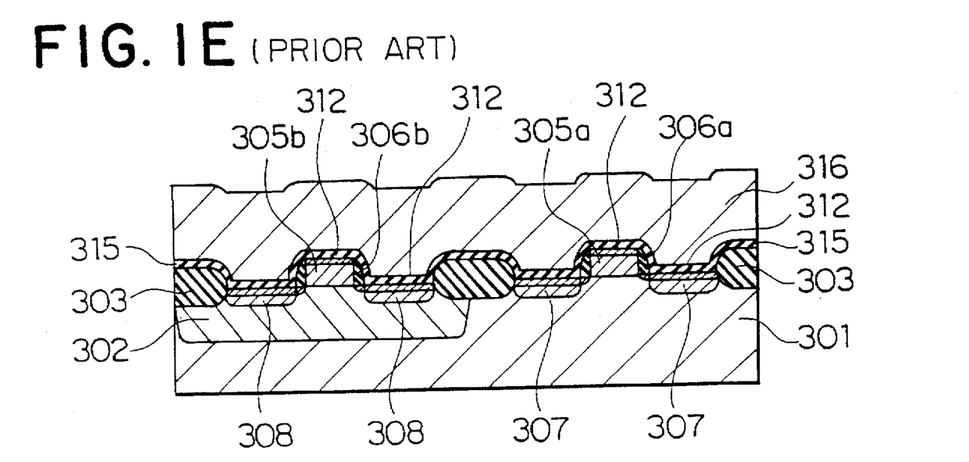

Subsequently, as shown in FIG. 1E, silicon oxide layer 315 containing no impurity is deposited on the field oxide layer 303, the side wall insulation layer 306a and 306b, and the titanium silicide layer 312, and so forth as an interlayer insulation layer. Then, on the silicon oxide layer 315, a silicon oxide layer 316 containing an impurity, such as boron or phosphorous and so forth, is deposited, and then the silicon oxide layer 315 formed as the interlayer insulation layer and the silicon oxide layer 316 are annealed.

Through such salicide process, N-type and P-type impurity diffusion layers 307 and 308 are formed into silicide in self-align manner. Therefore, resistances in the source-drain region (N-type and P-type impurity diffusion layers 307 and 308) are lowered to rise operation speed of the device. Also, the salicide process is advantageous for capability of selective siliciding of the necessary regions.

Also, as similar the salicide process, there is a technology for forming TiSi₂ on Si substrate or polycrystalline silicon selectively exposed from insulative SiO₂ layer in self-align manner, as disclosed in U.S. Pat. No. 4,545,116.

FIGS. 2A to 2E are sections showing the fabrication process for TiSi₂ as disclosed in the above-identified U.S. Pat. No. 4,545,116.

Figure 2A:
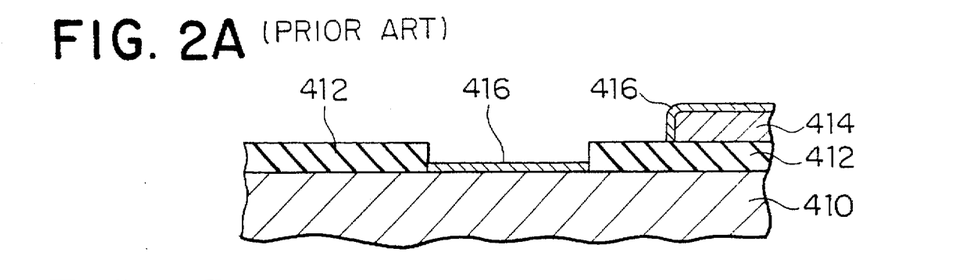
FIGS. 2A to 2E are sectional views showing the conventional TiSi$_2$ fabrication process shown in order of the fabrication process steps.

As shown in FIG. 2A, a SiO₂ layer 412 is formed on a silicon substrate 410 by thermal oxidation method or CVD method. Then, the SiO₂ layer 412 is patterned to selectively expose the silicon substrate 410. Next, a polycrystalline silicon is deposited and patterned to form a polycrystalline silicon layer 414 on the SiO₂ layer 412. Here, a natural oxide layer 416 is formed on the silicon substrate 410 and the polycrystalline silicon layer 414.

Figure 2B:
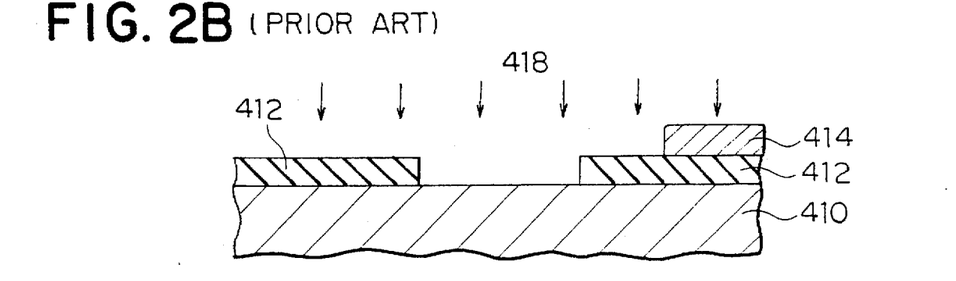

Subsequently, as shown in FIG. 2B, by causing collision of particles 418, the natural oxide layer 416 on the silicon substrate 410 and the polycrystalline silicon layer 414 is removed.

Figure 2C:
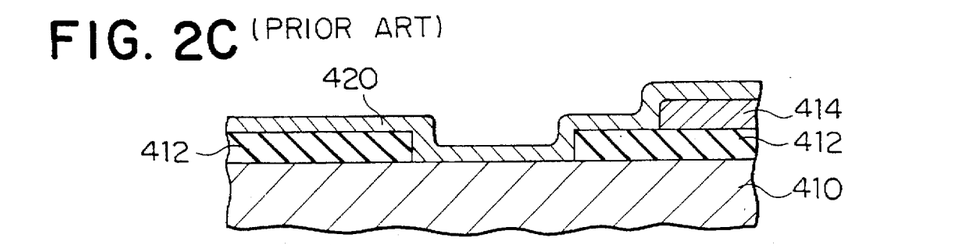

Then, as shown in FIG. 2C, a metal layer 420 is deposited on the silicon substrate 410, the SiO₂ layer 412 and the polycrystalline silicon layer 414.

Figure 2D:
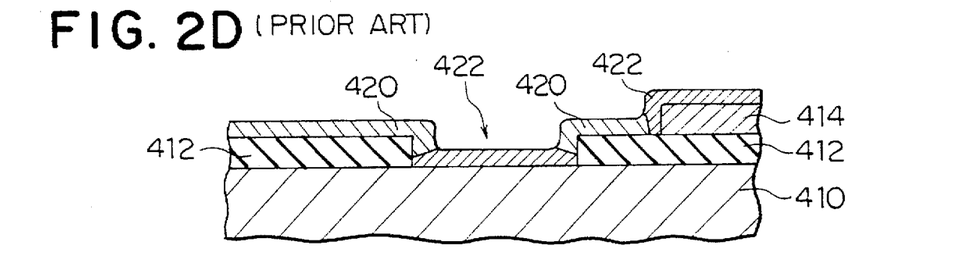

Thereafter, as shown in FIG. 2D, by effecting thermal process for these in inert gas atmosphere, reaction of the silicon substrate 410 and polycrystalline silicon layer 414 with the metal layer 420 is occurred the metal layer 420 contacting with the silicon substrate 410 and the polycrystalline silicon layer 414 into a metal silicide layer 422.

Figure 2E:
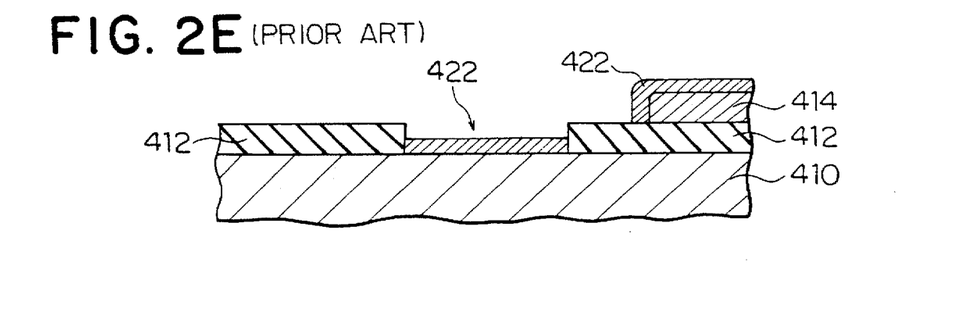

Then as shown in FIG. 2E, the metal layer 420 not reacted with the silicon or polycrystalline silicon is removed. Thereafter, annealing is performed for further reducing resistance of the metal silicide layer 422.

Even in the salicide process shown in FIG. 2, similarly to the prior art discussed with respect to FIG. 1, necessary region may be selectively silicided to reduce resistance.

However, in the salicide process shown in FIG. 1, since the field insulation layer 303 and the side wall insulation layer 306a and 306b are made of silicon oxide layer or the silicon nitride layer, the titanium layer 309 on these insulation layers 303, 306a and 306b slightly react with the silicon oxide layer or silicon nitride layer by performing the first RTA. Accordingly, thin titanium silicide layer is formed over the field insulation layer 303 and the side wall insulation layers 306a and 306b. This titanium silicide layer cannot be removed by wet etching with the mixture of the ammonia solution and hydrogen peroxide.

Accordingly, between the gate electrodes 305a and 305b, between the gate electrodes 305a and 305b, and the impurity diffusion layers 307 and 308, and between the N-type impurity diffusion layer 307 and the P-type impurity diffusion layer 308, electrical leakage may be caused through the thin titanium silicide layer formed on the insulation layers 303, 306a and 306b. Once leakage is caused, electrical characteristics of the semiconductor device is degraded and lowers yield in fabrication.

Also, even in the process of FIGS. 2A to 2E, since the metal layer 422 may slightly react with the SiO₂ layer 412, electrical leakage may be caused between the Si substrate 410 and the polycrystalline silicon layer 414.

SUMMARY OF THE INVENTION

It is a first object of the present invention to provide a fabrication process for a semiconductor device having a MOS field effect transistor, which can avoid electrical leakage between regions where the low resistance metal silicide layer is formed, and thus has high reliability with high yield in fabrication.

A second object of the invention is to provide a fabrication process for a semiconductor device which can reduce process steps in fabrication and improve yield.

According to the first aspect of the invention, a fabrication process for a semiconductor device having a MOS type field effect transistor comprises:

a step of forming an insulation layer for selectively exposed to a surface of semiconductor layer;

a step of forming a refractory metal silicide layer on the exposed surface of the semiconductor layer and the insulation layer; and a step of oxidizing refractory metal silicide layer formed on the insulation layer.

According to the second aspect of the invention, a fabrication process for a semiconductor device having a MOS type field effect transistor comprises:

a first step of selectively forming an insulation layer on a semiconductor substrate;

a second step of depositing a refractory metal layer on the semiconductor substrate and the insulation layer;

a third step of siliciding the refractory metal layer on the semiconductor substrate and forming a refractory metal silicide layer, in which a part of refractory metal layer on the insulation layer is silicided to form a refractory metal silicide thin film; and a fourth step of oxidizing refractory metal silicide thin film formed on the insulation layer to be insulative.

The fabrication process may further comprise a fifth step of removing non-reacted refractory metal layer which is not silicided on the insulation layer, between the third and fourth steps. Also, the fabrication process may further comprise a sixth step of depositing an interlayer insulation layer on the refractory metal silicide layer and the refractory metal silicide thin film, and a seventh step of annealing of the interlayer insulation layer, after the fourth step.

On the other hand, the fabrication process may further comprise an eighth step of depositing an interlayer insulation layer on the refractory metal silicide layer and the refractory metal silicide thin film, between the third and fourth steps.

In the third step, thermal process may cause reaction of a semiconductor material formed on the semiconductor substrate and a refractory metal forming the refractory metal layer to form the refractory metal silicide layer.

In the fourth step, the refractory metal silicide thin film may be oxidized by performing heat treatment under oxidizing gas atmosphere.

The heat treatment may be performed at 800° to 850° C. for 10 sec, and in the fourth step, the refractory metal silicide thin film may be oxidized by plasma process of oxidizing gas for 1 min. The refractory metal silicide thin film is oxidized by heat treatment at 800° to 850° C. for 10 sec. under plasma atmosphere of oxidizing gas.

According to the third aspect of the invention, a fabrication process for a semiconductor device having a MOS type field effect transistor comprising:

a first step of selectively forming an gate insulation layer on a semiconductor substrate;

a second step of forming a gate electrode on the gate insulation layer, which gate electrode being formed of a semiconductor material;

a third step of forming side wall on the side surfaces of the gate electrode, which side wall being formed by the insulative material;

a fourth step of forming a source region and a drain region on the surface of the semiconductor substrate;

a fifth step of depositing a refractory metal layer on the gate electrode, the side wall, the source region and the drain region;

a sixth step for forming refractory metal silicide by siliciding the refractory metal layer on the gate electrode, the side wall, the source region and the drain region, in which a part of refractory metal layer on the side wall is silicided to form a refractory metal silicide thin film; and a seventh step of oxidizing refractory metal silicide thin film on the side wall to be insulative.

With the present invention, after removing refractory metal layer on the insulation layer for insulating the metal silicide layer of low resistance, low resistance metal silicide thin film remaining on the insulation layer is oxidized to be insulated. Therefore, it is successful to prevent electrical leakage between the adjacent low resistance metal silicide layers. Accordingly, the semiconductor layer having good electric characteristics and having high reliability can be fabricated at high yield.

On the other hands, when the interlayer insulation layer is formed on the metal silicide layer and the metal silicide thin film and so forth before the step of oxidizing the low resistance metal silicide thin film, via the interlayer insulation layer, a large amount of oxygen can be supplied to the metal silicide thin film on the insulation layer. Thus, the step for oxidizing the metal silicide thin film is facilitated. Furthermore, in conjunction with the step of oxidizing the metal silicide thin film, the step of causing phase transition for further reducing resistance of the metal silicide layer and the step of annealing of the interlayer insulation layer can be performed simultaneously. Therefore, number of process steps in fabrication of the semiconductor device can be reduced.

Furthermore, in the present invention, when the titanium is used as refractory metal and the silicon substrate is used as semiconductor substrate, electrical leakage caused between the low resistance metal silicide layers can be sufficiently avoided by the oxide of the titanium silicide layer. Accordingly, semiconductor device of superior electrical characteristics, high reliability can be fabricated in high yield.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings.

DESCRIPTION OF THE PREFERRED EMBODIMENT

The present invention will be discussed hereinafter in detail with reference to the drawings, particularly to FIGS. 3A to 5D. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid obscuring the present invention.

FIGS. 3A to 3E are sections showing the first embodiment of a semiconductor device fabrication process according of the present invention, in order to the process steps.

Figure 3A:
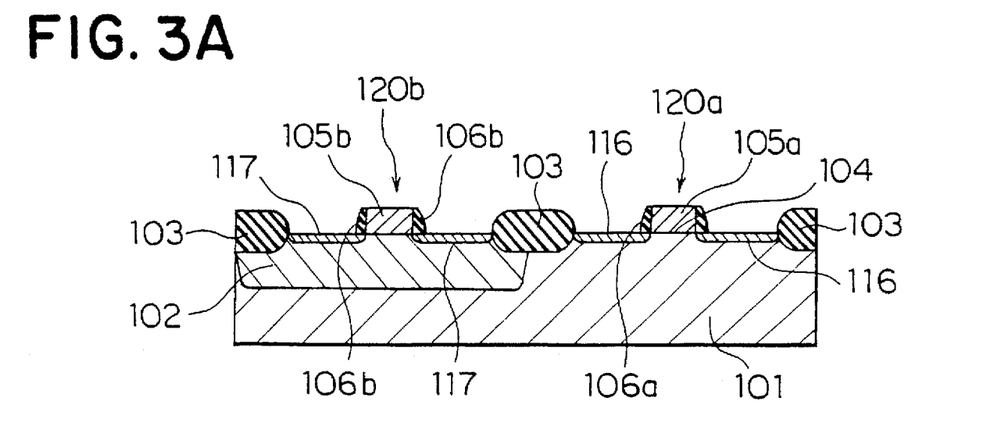
FIGS. 3A to 3E are sectional views showing the first embodiment of a semiconductor device fabrication process according to the present invention.

As shown in FIG. 3A, N-type ions are implanted to a reserved region 120b for forming a PMOS transistor, which region will be hereinafter referred to as PMOS transistor reserved region 120b, on the surface of the P-type silicon substrate 101. Thereafter, activation heat treatment is performed for forming N-well region 102. Then, by selective oxidation, a field oxide layer (field insulation layer) 103 is formed in a thickness of 360 nm, for example, in order to separate a reserved region 120a for forming an NMOS transistor, which region will be hereinafter referred to as the NMOS transistor reserved region 120a, and the PMOS transistor reserved region 120b.

Next, by a thermal oxidation method, gate oxide layer (gate insulation layer) 104 of a thickness of 10 nm, for example, is formed on the NMOS transistor reserved region 120a and the PMOS transistor reserved region 120b. Also, by CVD, a gate electrode layer (not shown) of polycrystalline silicon of a thickness of 150 nm, for example, is formed over the gate oxide layer 104. Then, a photolithographic method and a dry etching method, the gate electrode layer is patterned into a predetermined configuration to form gate electrodes 105a and 105b in the NMOS transistor reserved region 120a and the PMOS transistor reserved region 120b respectively.

Subsequently, by employing a photolithographic method and an ion implantation method, N-type ions, such as arsenic, phosphorous and so forth or P-type ions, such as boron and so forth, are implanted at a predetermined position. Thereafter, activation heat treatment is performed. Thus, in the NMOS transistor reserved region 120a, namely the surface of the P-type silicon substrate 101 where the N-well region 102 is not formed, an N$^-$ type impurity diffusion layer 116 is formed. Similarly, in the PMOS transistor reserved region 120b, namely the surface of the N-well region 102, a P$^-$ type impurity diffusion layer 117 is formed.

Thereafter, by CVD, a silicon oxide layer or silicon nitride layer of 70 nm in thickness is grown over the entire surface of the silicon substrate 101, the gate electrodes 105a and 105b, the field oxide layer 103 and so forth. Then, by way of anisotropic etch-back, side walls 106a and 106b are formed on the side surfaces of the gate electrodes 105a and 105b.

Figure 3B:
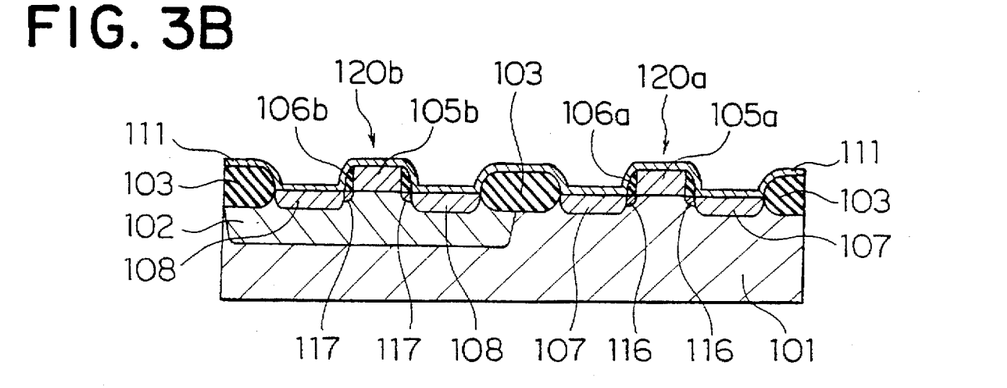

Then, as shown in FIG. 3B, after implanting ions into the N$^+$ type impurity diffusion layer 116 and the P$^+$ type impurity diffusion layer 117 by a photolithographic method, heat treatment is effected to form an N-type impurity diffusion later 107 containing arsenic or phosphorous as an impurity and a P-type impurity diffusion layer 108 containing boron as an impurity. The heat treatment is performed at 900° C. for 20 min. under a nitrogen atmosphere, for example. By this heat treatment, the silicon crystal in which defect is introduced by the ion implantation is recovered, and in conjunction therewith, the impurity is activated. Thus, As a LDD (Lightly Doped Drain) structure, N-type source and drain region (N-type impurity diffusion layer 107) is formed in the NMOS transistor reserved region 120a, and P-type source and drain region (P-type impurity diffusion layer 108) is formed in the PMOS transistor reserved region 120b. Then, after removing the natural oxide layer (not shown) naturally formed on the gate electrodes 105a and 105b and the impurity diffusion layers 107 and 108 by dilute hydrogen fluoride, a titanium layer 111 is formed by depositing titanium over the entire surface of the gate electrodes 105a and 105b, and the impurity diffusion layers 107 and 108 are formed in a thickness of 30 nm, for example, by way of sputtering, such as a D.C. magnetron sputtering method.

Figure 3C:
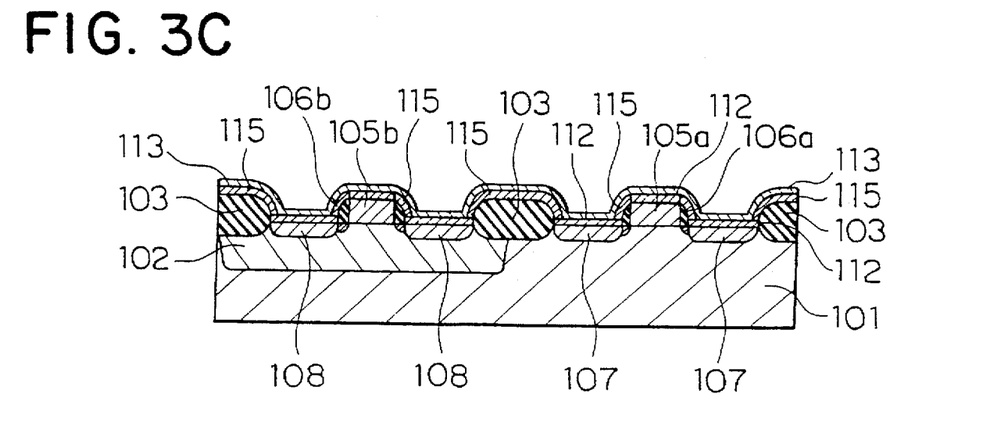

Thereafter, as shown in FIG. 3C, by first performing RTA for 30 sec. at 650° C. under a nitrogen atmosphere, the titanium layer 111 directly contacting gate electrodes 105a and 105b and silicon substrate 101 reacts with silicon to form titanium silicide layer 112 of C49 structure. At this time, the regions of the titanium layer 111 which are on the field oxide layer 103 and the side walls 106a and 106b and the upper part of the region of the titanium layer 111 which is formed on the silicon substrate 101 reacts with $N_2$ gas to produce titanium nitride layers 113. At the same time, the field oxide layer (silicon oxide layer) 103 and the side walls (silicon oxide layer or silicon nitride layer) 106a and 106b slightly react with the titanium layer 111 to form titanium silicide thin film 115 of a thickness of approximately 5 nm at the interface between the field oxide layer 103 and side walls 106a and 106b, and the titanium layer 111.

Figure 3D:
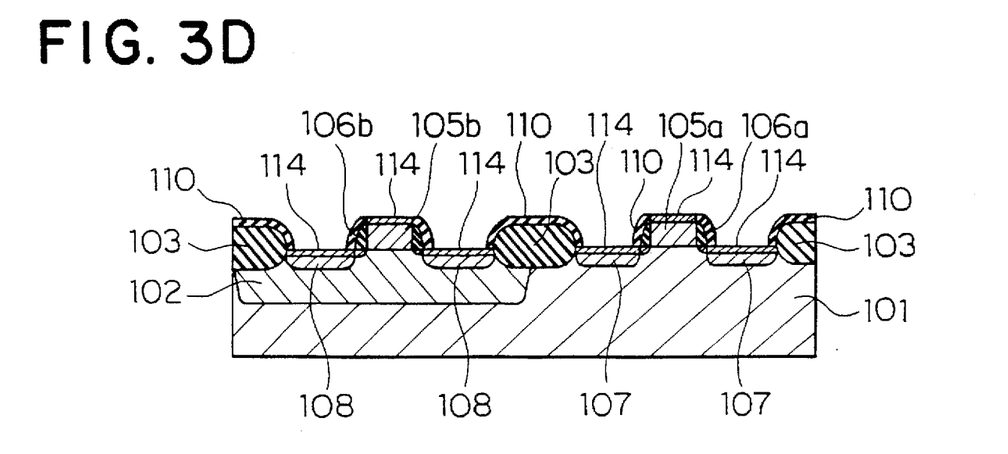

Thereafter, as shown in FIG. 3D, wet etching is performed with a mixture of ammonia water and hydrogen peroxide solution to selectively remove the titanium nitride layer 113. Then, under an oxygen atmosphere, a second RTA is performed for 10 sec at 850° C. for oxidation of titanium silicide thin film 115, formed on the field oxide layer 103 and the side walls 106a and 106b, to form insulation layer 110 for isolation. At the same time, the titanium silicide layer 112 of C49 type structure undergoes caused phase transition into titanium silicide layer 114 of C54 type structure to reduce resistance of the titanium silicide layer.

Figure 3E:
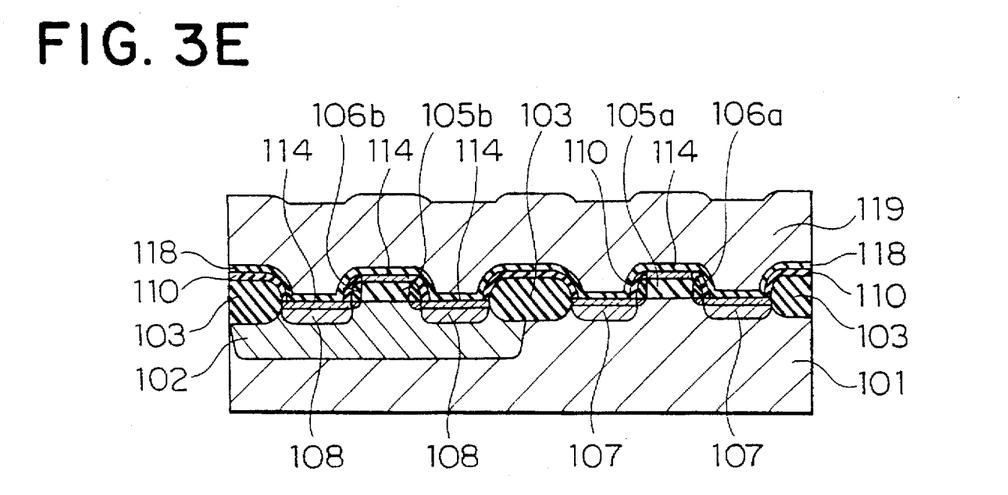

Subsequently, as shown in FIG. 3E, by way of CVD, the silicon oxide layer (interlayer insulation layer) 118 not containing no impurity is deposited in a thickness of 100 nm, for example. Then, in the similar manner, by CVD method, a silicon oxide layer 119 containing boron or phosphorous is deposited in the thickness of 400 nm, for example for annealing of the silicon oxide layer (interlayer insulation layer) 118.

In the process step shown in FIG. 3D, after removing the titanium nitride layer 113 by wet etching to oxidize the titanium silicide thin film 115, heat treatment is performed for 10 sec at a temperature higher than or equal to 800° C. under an oxygen atmosphere. At this time, if the temperature is elevated or heat treatment is performed for a longer period, the remaining titanium silicide thin film 115 on the insulation layer is more easily made insulative. However, the titanium silicide layer in a thickness of about 40 nm forming on the fine width of the gate electrode in the extent of less than or equal to 0.5 μm and the diffusion layer has low heat resistance. Accordingly, when heat treatment is performed at 860° C. for 10 sec. or at 750° C. for 1 min., the titanium silicide layer may cause agglomeration to have high resistance. From this fact, in the present invention, the condition of heat treatment for oxidation of the titanium silicide thin film is selected to be at a temperature of 800° to 850° C. for 10 sec.

The process for forming the interlayer insulation layer (silicon oxide layer 118) and annealing may be performed before the step of oxidation of the titanium silicide thin film 115 by the second RTA. This fabrication process will be discussed hereinafter as the second embodiment of the invention.

FIGS. 4A to 4E are sections showing the second embodiment of the fabrication process of the semiconductor device according to the present invention. In the second embodiment discussed hereinafter, like reference numerals to the foregoing first embodiment would identify the same or similar elements to the first embodiment, and the detailed description for such common elements will be neglected to keep the disclosure simple enough to facilitate a clear understanding of the invention.

Figure 4A:
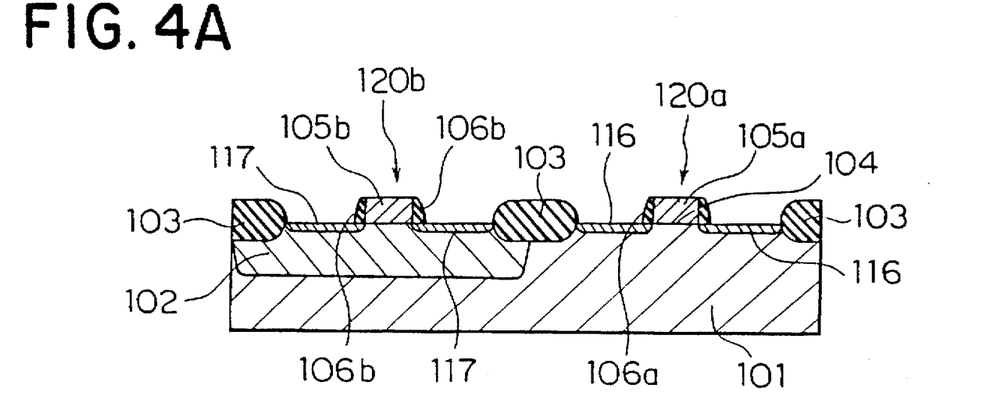
FIGS. 4A to 4E are sectional views showing the second embodiment of the semiconductor device fabrication process according to the invention.

As shown in FIG. 4A, on the PMOS transistor reserved region 120b on the surface of the P-type silicon substrate 101, the N-well region 102 is formed. Then, the field oxide layer (field insulation layer) 103 is formed in order to separate a NMOS transistor reserved region 120a, and the PMOS transistor reserved region 120b.

Next, the gate oxide layer (gate insulation layer) 104 is formed on the NMOS transistor reserved region 120a and the PMOS transistor reserved region 120b. Also, by CVD method, a gate electrode layer (not shown) of polycrystalline silicon is formed over the gate oxide layer 104 to form gate electrodes 105a and 105b in the NMOS transistor reserved region 120a and the PMOS transistor reserved region 120b.

Subsequently, an $N^-$ type impurity diffusion layer 116 is formed on the surface of the P-type silicon substrate 101 where the N-well region 102 is not formed. Similarly, $P^-$ type impurity diffusion layer 117 is formed on the surface of the N-well region 102.

Thereafter, the silicon oxide layer or silicon nitride layer is grown over the entire surface of the silicon substrate 101, the gate electrodes 105a and 105b, the field oxide layer 103 and so forth. Then, by way of anisotropic etch-back, side walls 106a and 106b are formed on the side surfaces of the gate electrodes 105a and 105b.

Figure 4B:
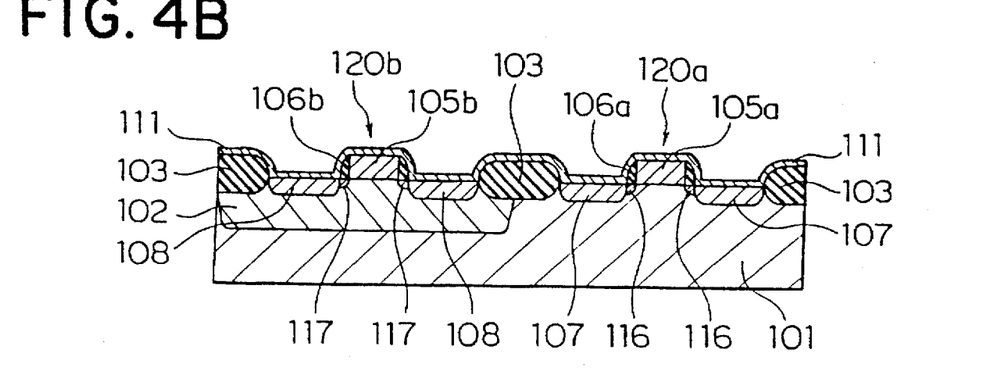

Then, as shown in FIG. 4B, implanting ions into the $N^+$ type impurity diffusion layer 116 and the $P^+$ type impurity diffusion layer 117 is performed to form an N-type impurity diffusion later 107 and a P-type impurity diffusion layer 108. After removing the natural oxide layer (not shown) naturally formed on the gate electrodes 105a and 105b and the impurity diffusion layers 107 and 108, a titanium layer 111 is formed by depositing titanium over the entire surface of the gate electrodes 105a and 105b and the impurity diffusion layers 107 and 108 by way of sputtering.

Figure 4C:
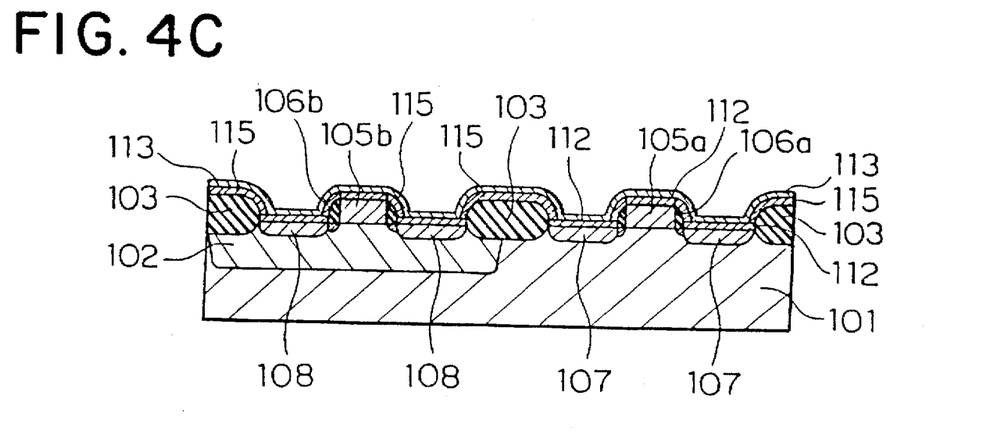

Thereafter, as shown in FIG. 4C, by performing first RTA for 30 sec. at 650° C. under nitrogen atmosphere, the titanium layer 111 directly contacting with the gate electrodes 105a and 105b and the silicon substrate 101 is reacted with silicon to form titanium silicide layer 112 of C49 structure. At this time, upper parts of the titanium layer 111 on the field oxide layer (silicon oxide layer) 103 and the side walls 106a and 106b (silicon oxide layer or silicon nitride layer) are reacted with $N_2$ gas to produce titanium nitride layers 113. However a titanium silicide thin film 115 is formed at the interface between the field oxide layer 103 and the side walls 106a and 106b, and the titanium layer 111, by the reaction of the silicon oxide layer and the silicon nitride layer with the titanium layer.

The fabrication process up to the step illustrated in FIGS. 4A to 4C are the same as those illustrated in FIGS. 3A to 3C.

Figure 4D:
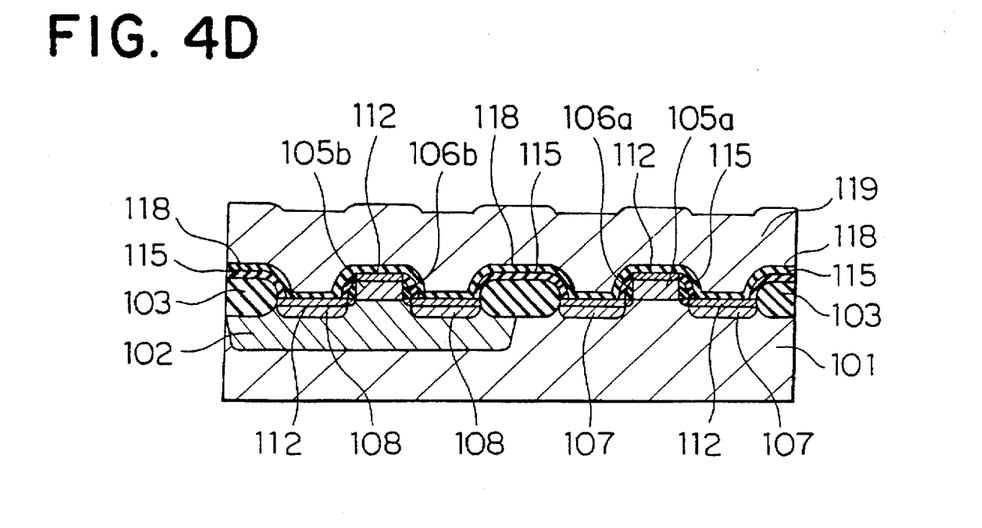

Subsequently, as shown in FIG. 4D, the titanium nitride layer 113 is selectively removed by wet etching with the mixture of ammonia water and hydrogen peroxide solution. Then, by way of CVD, the silicon oxide layer (interlayer insulation layer) 118 not containing impurity is deposited over the entire surface of the titanium silicide layer 112 and the titanium silicide thin film 115. Subsequently, on the silicon oxide layer 118, the silicon oxide layer containing impurity of boron or phosphorous and so forth is deposited.

Figure 4E:
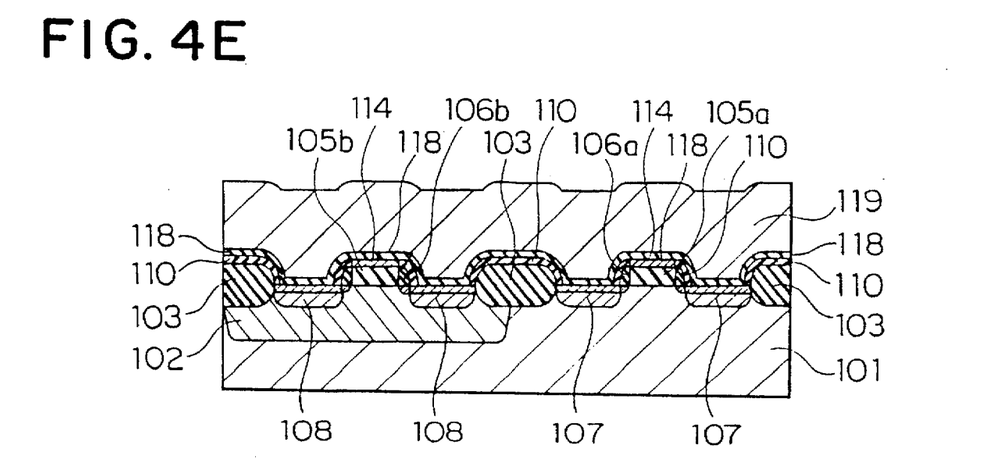

Subsequently, as shown in FIG. 4E, under a nitrogen atmosphere, the second RTA is performed at 850° C. for 10 sec for oxidation of the titanium silicide thin film 115 formed on the field oxide layer 103 and the side walls 106a and 106b to form insulation layer 110 for electrical insulation.

In the second embodiment, since heat treatment is performed after depositing the silicon oxide layer (interlayer insulation layer) 118, a greater amount of oxygen can be efficiently supplied from the silicon oxide layer 118 to the titanium silicide thin film 115. Therefore, in comparison with the first embodiment, in which the titanium silicide thin film 115 exposed to the surface is subject heat treatment under oxygen atmosphere, the titanium silicide thin film is more easily oxidized.

Also, the heat treatment causes phase transition of the titanium silicide layer 112 of C49 type structure into the titanium silicide layer 114 of C54 type structure to lower electrical resistance. Furthermore, heat treatment achieves annealing effect for the silicon oxide layer (interlayer insulation layer) 118. Accordingly, in comparison with the first embodiment, number of process steps in fabrication of the semiconductor device can be reduced.

In addition, since it becomes possible to reduce the number of cycles of heat treatment for the titanium silicide layer of approximately 40 nm in thickness on the gate electrodes and the diffusion layer of a fine width less than or equal to 0.5 μm, the agglomeration of the titanium silicide layer by a plurality of heat treatments causing of increase in resistance can be successfully avoided.

Reliability of the semiconductor devices is evaluated by measuring leakage current value with respect to various MOS type field effect transistors, on which the titanium silicide layers were formed in various mutually distinct methods.

FIGS. 5A to 5D are histograms showing leakage current values between the gate electrode and source and drain regions, in which the horizontal axes represent the leakage current values. It should be noted that, as the semiconductor device, a plurality of mutually parallel P-channel MOS transistors to have 80 cm of total gate width was used, and −4V of voltage was applied to the gate electrodes.

Figure 5A:
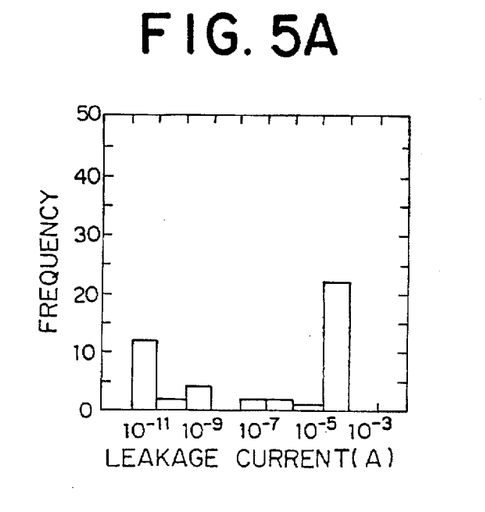
FIGS. 5A to 5D are histograms showing leakage current values between the gate electrode and the source-drain region with the leakage current in the horizontal axis.

FIG. 5A shows a histogram of the result of measurement of the leakage current value with respect to a first comparative example of MOS transistors, in which the titanium silicide layer is formed by the conventional method. Namely, the titanium silicide layer was formed by performing first RTA (Rapid Thermal Annealing) at 650° C. for 30 sec. under nitrogen atmosphere, and subsequently performing second RTA at 850° C. for 10 sec. under nitrogen atmosphere. Thereafter, the silicon oxide layer was deposited as the interlayer insulation layer and annealing was performed at 700° C. for 30 sec. under nitrogen atmosphere.

As shown in FIG. 5A, a large amount of leakage current of $10^{-5}$ to $10^{-3}$ (A) results. Therefore, reliability of the semiconductor device was insufficient.

Figure 5B:
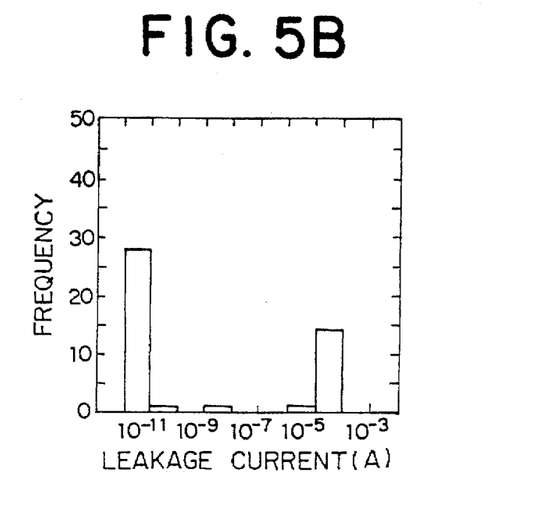

FIG. 5B shows a histogram of the result of measurement of a second comparative example of the MOS transistor, in which oxidation step for oxidation of the titanium silicide layer before annealing after the second RTA, in the conventional method. Namely, in the shown example, the titanium silicide layer was formed by performing first RTA at 650° C. for 30 sec. under nitrogen atmosphere, and subsequently performing second RTA at 850° C. for 10 sec. under a nitrogen atmosphere. Thereafter, a third RTA is performed at 850° C. for 10 sec. under oxygen atmosphere for oxidizing the titanium silicide thin film. Then, the silicon oxide layer was deposited as the interlayer insulation layer and annealing was performed at 700° C. for 30 sec. under nitrogen atmosphere.

As shown for FIG. 5B, in the second comparative example, the leakage current value is $10^{-5}$ to $10^{-3}$ (A) which is smaller than that in the first comparative example. However, despite the fact that the third RTA was performed for oxidation of the titanium silicide thin film, the leakage current cannot be completely eliminated. Therefore, the effect for suppression of occurrence of the leakage current cannot be sufficient.

Figure 5C:
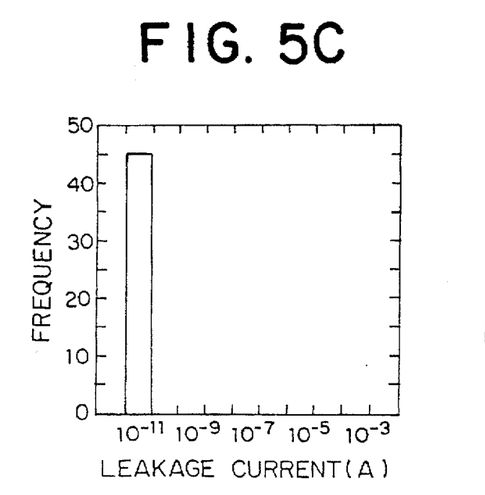

FIG. 5C shows a histogram of the result of measurement of the leakage current value with respect to a first embodiment of MOS transistors, in which the titanium silicide layer is formed by the first embodiment of the fabrication process. Namely, the titanium silicide layer was formed by performing first RTA (Rapid Thermal Annealing) at 650° C. for 30 sec. under nitrogen atmosphere, and subsequently performing second RTA at 850° C. for 10 sec. under oxygen atmosphere. Thereafter, the silicon oxide layer was deposited as the interlayer insulation layer and annealing was performed at 700° C. for 30 sec. under nitrogen atmosphere.

Figure 5D:
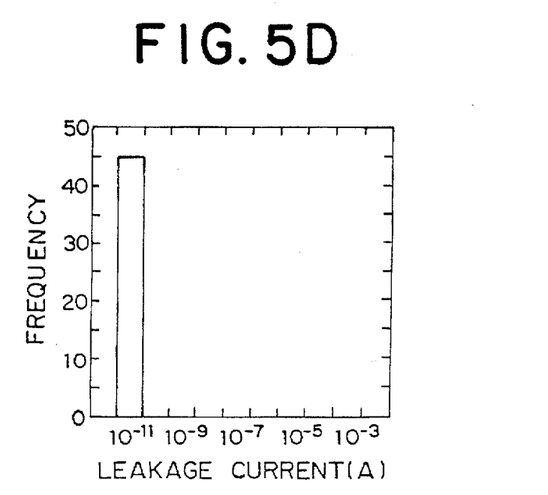

FIG. 5D shows a histogram of the result of measurement of the leakage current value with respect to a second embodiment of MOS transistors, in which the titanium silicide layer is formed by the second embodiment of the fabrication process. Namely, the titanium silicide layer was formed by performing first RTA (Rapid Thermal Annealing) at 650° C. for 30 sec. under nitrogen atmosphere, and subsequently, the silicon oxide layer was deposited as the interlayer insulation layer. Thereafter, second RTA was performed at 850° C. for 10 sec. under nitrogen atmosphere.

As shown in FIGS. 5C and 5D, the MOS transistors fabricated according to the first and second embodiments of the present invention, the remained titanium silicide thin film on the insulation layer is oxidized to be insulative. Thus, effect for avoiding occurrence of leakage current is remarkable.

In general, it has been known that titanium silicide formed by reaction between the silicon oxide layer or silicon nitride layer and titanium is $Ti_5Si_3$ as a titanium rich titanium silicide (Journal of Applied Physics, 1988, pp 344 to 353). Accordingly, what can be oxidized by heat treatment in a short period at 800° C. for 10 sec. under oxygen atmosphere is thin $Ti_5Si_3$.

On the other hand, in the second comparative example, similarly to the first and second embodiments, after removal of the titanium nitride, $Ti_5Si_3$ remains on the insulation layer. However, by the second RTA (heat treatment at 850° C. for 10 sec. under nitrogen atmosphere), $Ti_5Si_3$ is converted into titanium disilicide ($TiSi_2$). Therefore, even by the third RTA (heat treatment at 800° C. for 10 sec. under oxygen atmosphere), it becomes difficult to oxidize the titanium silicide layer.

Accordingly, in the present invention, it is required to selectively remove titanium nitride by wet etching after forming titanium silicide layer by the first RTA, and subsequently to perform heat treatment for oxidizing the remained titanium silicide layer ($Ti_5Si_3$) on the insulation layer.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

While the titanium silicide thin film 115 is oxidized by RTA at 800° to 850° C. for 10 sec. under oxygen atmosphere in the first and second embodiments, the method of the present invention should not be limited to this method. For instance, as the oxidation process, titanium silicide thin film may be oxidized to be insulative by employing oxygen plasma process for 1 min. or employing RTA at 850° C. for 10 sec. during oxygen plasma process.

On the other hand, while discussion has been given for the case where titanium is employed as a material for siliciding, the present invention is effective not only for titanium but also other refractory metal. Namely, concerning MOS transistor where refractory metal silicide is formed, the refractory metal silicide thin film remaining on the insulation layer may be oxidized by the similar method.

What is claimed is:

1. A fabrication process for a semiconductor device having a MOS type field effect transistor comprising the steps of:

selectively forming an insulation layer on a semiconductor layer, whereby a surface of said semiconductor layer is selectively exposed;

forming a refractory metal silicide layer on the exposed surface of said semiconductor layer and said insulation layer; and oxidizing said refractory metal silicide layer formed on said insulation layer.

2. A fabrication process for a semiconductor device having a MOS type field effect transistor comprising:

a first step of selectively forming an insulation layer on a semiconductor substrate;

a second step of depositing a refractory metal layer on said semiconductor substrate and said insulation layer;

a third step of siliciding the refractory metal layer on said semiconductor substrate and forming a refractory metal silicide layer, in which a part of the refractory metal layer on said insulation layer is silicided to form a refractory metal silicide thin film; and a fourth step of oxidizing the refractory metal silicide thin film formed on said insulation layer to be insulative.

3. A fabrication process for a semiconductor device as set forth in claim 2, which further comprises a fifth step of removing non-silicided part of said refractory metal layer which is not silicided on said insulation layer, between said third and fourth steps.

4. A fabrication process for a semiconductor device as set forth in claim 2, which further comprises a sixth step of depositing an interlayer insulation layer on said refractory metal silicide layer and said refractory metal silicide thin film, and a seventh step of annealing of said interlayer insulation layer, after said fourth step.

5. A fabrication process for a semiconductor device as set forth in claim 2, which further comprises an eighth step of depositing an interlayer insulation layer on said refractory metal silicide layer and said refractory metal silicide thin film, between said third and fourth steps.

6. A fabrication process for a semiconductor device as set forth in claim 2, wherein in said third step, a thermal process causes reaction of a semiconductor material formed on said semiconductor substrate with a refractory metal forming said refractory metal layer to form said refractory metal silicide layer.

7. A fabrication process for a semiconductor device as set forth in claim 2, wherein in said fourth step, said refractory metal silicide thin film is oxidized by performing heat treatment under oxidizing gas atmosphere.

8. A fabrication process for a semiconductor device as set forth in claim 7, wherein said heat treatment is performed at 800° to 850° C. for 10 sec.

9. A fabrication process for a semiconductor device as set forth in claim 2, wherein in said fourth step, said refractory metal silicide thin film is oxidized by plasma process of oxidizing gas for 1 min.

10. A fabrication process for a semiconductor device as set forth in claim 2, wherein in said fourth step, said refractory metal silicide thin film is oxidized by heat treatment at 800° to 850° C. for 10 sec. under plasma atmosphere of oxidizing gas.

11. A fabrication process for a semiconductor device as set forth in claim 4, wherein said interlayer insulation layer is formed with a silicon oxide layer.

* * * * *